(12) United States Patent
Yang et al.

(10) Patent No.: US 9,159,476 B2
(45) Date of Patent: Oct. 13, 2015

(54) NEGATIVE DIFFERENTIAL RESISTANCE DEVICE

(75) Inventors: Jianhua Yang, Palo Alto, CA (US); Minxian Max Zhang, Mountain View, CA (US); R Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 251 days.

(21) Appl. No.: 13/982,672

(22) PCT Filed: Feb. 1, 2011

(86) PCT No.: PCT/US2011/023284
§ 371 (c)(1),
(2), (4) Date: Jul. 30, 2013

(87) PCT Pub. No.: WO2012/105955
PCT Pub. Date: Aug. 9, 2012

(65) Prior Publication Data
US 2013/0307662 A1 Nov. 21, 2013

(51) Int. Cl.
*H01C 7/10* (2006.01)
*H01C 7/04* (2006.01)
*H01L 47/00* (2006.01)
*H01L 27/26* (2006.01)

(52) U.S. Cl.
CPC ............... *H01C 7/10* (2013.01); *H01C 7/041* (2013.01); *H01C 7/043* (2013.01); *H01L 27/26* (2013.01); *H01L 47/00* (2013.01)

(58) Field of Classification Search
CPC ........................................................ H01C 7/10
See application file for complete search history.

(56) References Cited

U.S. PATENT DOCUMENTS

| | | | |
|---|---|---|---|
| 3,149,398 A * | 9/1964 | Sprague et al. | 29/25.42 |
| 5,403,748 A | 4/1995 | Pernisz | |
| 6,184,772 B1 | 2/2001 | Kawase et al. | |
| 6,801,451 B2 * | 10/2004 | Tran et al. | 365/158 |
| 7,701,748 B2 | 4/2010 | Lee et al. | |
| 7,773,365 B2 | 8/2010 | Herman et al. | |

(Continued)

FOREIGN PATENT DOCUMENTS

| CN | 100424783 | 4/2004 |
|---|---|---|
| CN | 101116154 | 1/2008 |

(Continued)

OTHER PUBLICATIONS

International Search Report, Oct. 26, 2011, PCT Patent Application No. PCT/US2011/023284.

(Continued)

*Primary Examiner* — James Harvey
(74) *Attorney, Agent, or Firm* — Hewlett-Packard Patent Department (57) ABSTRACT

Apparatus and methods related to negative differential resistance (NDR) are provided. An NDR device includes a spaced pair of electrodes and at least two different materials disposed there between. One of the two materials is characterized by negative thermal expansion, while the other material is characterized by positive thermal expansion. The two materials are further characterized by distinct electrical resistivities. The NDR device is characterized by a non-linear electrical resistance curve that includes a negative differential resistance range. The NDR device operates along the curve in accordance with an applied voltage across the pair of electrodes.

15 Claims, 4 Drawing Sheets

(56) References Cited

U.S. PATENT DOCUMENTS

| | | | |
|---|---|---|---|
| 8,289,749 B2 * | 10/2012 | Chen et al. | 365/148 |
| 2009/0231782 A1 | 9/2009 | Fujita et al. | |
| 2013/0307662 A1 * | 11/2013 | Yang et al. | 338/20 |

FOREIGN PATENT DOCUMENTS

| | | |
|---|---|---|
| JP | 11-054301 | 2/1999 |
| JP | 2001-338838 | 12/2001 |
| JP | 2002-075706 | 3/2002 |
| JP | 2008-177611 | 7/2008 |
| KR | 10-19790000886 | 7/1979 |
| KR | 10-2011-0094584 A | 8/2011 |

OTHER PUBLICATIONS

Javadi, Hamid HS. "Composite Material Behavior Under Applied Electric Field." Jet Propulsion 1000: 161-213.

Kiehl, Richard. "Negative Differential Resistance Phenomena in Molecular Metal-Insulator-Metal Junctions." Bulletin of the American Physical Society 52 (2007).

* cited by examiner

NEGATIVE DIFFERENTIAL RESISTANCE DEVICE

STATEMENT REGARDING FEDERALLY SPONSORED RESEARCH OR DEVELOPMENT this invention has been made with government support awarded by Defense Advantage Research Projects Agency. The government has certain rights in the invention

BACKGROUND

New types of electronic devices are sought after by virtue of their new or distinct operating characteristics. The present teachings address the foregoing concerns.

BRIEF DESCRIPTION OF THE DRAWINGS

The present embodiments will now be described, by way of example, with reference to the accompanying drawings, in which.

DETAILED DESCRIPTION

Introduction

Methods and apparatus related to negative differential resistance (NDR) devices are provided. An NDR device includes a spaced pair of electrically conductive electrodes. Two different materials are disposed between the electrodes. One of the two materials is selected to include a negative thermal expansion, while the other material is characterized by positive thermal expansion. The material having negative thermal expansion is also characterized by a lesser electrical resistivity relative to the material having the positive thermal expansion.

The NDR device as a whole is characterized by a non-linear electrical resistance curve, which includes a negative differential resistance range. The NDR device operates along the curve in accordance with an applied voltage across (or current through) the pair of electrodes.

In one example, a device includes a first electrode and a second electrode spaced apart from the first electrode. The device also includes a first material disposed between, and in contact with, the first electrode and the second electrode. The first material is characterized by a first electrical resistivity. The device also includes a second material disposed between the first electrode and the second electrode. The second material is characterized by negative thermal expansion and a second electrical resistivity lesser than the first electrical resistivity. The device is characterized by an electrical resistance curve that varies non-linearly as a function of applied voltage.

In another example, a method includes the step of operating a negative differential resistance (NDR) device at a first electrical resistance by way of a first applied voltage. The NDR device has a first material and a second material respectively disposed between a first electrode and a second electrode, the second material having a negative thermal expansion characteristic. The method also includes the step of operating the NDR device at a second electrical resistance by way of a second applied voltage. The second electrical resistance being greater than the first electrical resistance, and the second applied voltage being greater than the first applied voltage.

First Illustrative Device

Figure 1A:
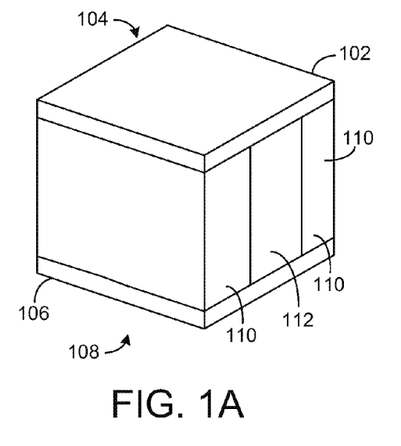
FIG. 1A depicts an isometric view of an NDR device according to one example of the present teachings.
Figure 1B:
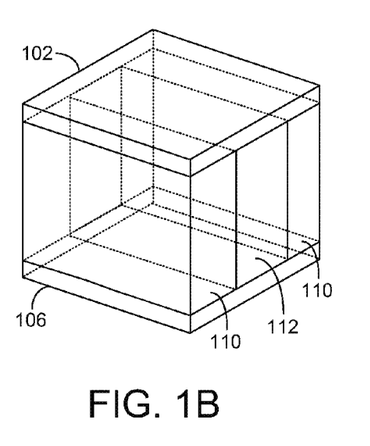
FIG. 1B depicts an isometric view of the NDR device of FIG. 1A in hidden-line view.

Reference is now directed to FIGS. 1A and 1B, which depict an isometric view of a device 100. The device 100 of FIG. 1B is depicted in hidden line-view in the interest of understanding. The device 100 is illustrative and non-limiting in nature. Thus, other devices, apparatus and systems are contemplated by the present teachings. The device 100 is also referred to as a negative differential resistance (NDR) device 100 for purposes herein.

The device 100 includes an electrode or high-conductivity (conductor) layer 102. The electrode 102 can be formed from or include any suitable electrically conductive material. Non-limiting examples of the electrode 102 material include copper, aluminum, silver, gold, platinum,palladium, titanium nitride (TiN), a metallic material, a doped semiconductor, and so on. Other suitable materials can also be used. The electrode 102 is configured to define an end area 104.

The electrode 102 is configured to electrically couple the device 100 with another entity or entities such as another NDR device, electronic circuitry, a controller, a data or electrical signaling buss, and so on. The electrode 102 can include one or more extensions (not shown) that respectively lead away from the device 100 in the interest of coupling with other devices or entities. Additionally, the end area 104 is characterized by a square cross-sectional shape. However, other NDR devices characterized by other respective cross-sectional shapes such as circular, elliptical, oval, rectangular, triangular, hexagonal, and so on, are contemplated by the present teachings.

The device 100 includes another electrode or high-conductivity (conductor) layer 106. The electrode 106 can be formed from or include any suitable electrically conductive material, including but not limited to those described above for the electrode 102. The electrode 106 is configured to define an end area 108 that is substantially equal in shape and dimensions to the end area 104. Other electrodes respectively varying in dimensions, shape or constituency with respect to an opposite end electrode can also be used. Thus, NDR devices having electrode-pair asymmetry are contemplated.

The device 100 also includes a first material 110. The first material 110 is included in two respective slab-like portions each of which is disposed between and in contact with the electrodes 102 and 106. The first material 110 is characterized by an electrical resistivity. The first material 110 can be defined by or include aluminum oxide ($Al_2O_3$), silicon dioxide ($SiO_2$), or hafnium(IV) oxide ($HfO_2$). Other suitable materials can also be used.

The device 100 further includes a second material 112. The second material 112 is included as one slab-like portion disposed between and in contact with the first material (portions) 110. The second material 112 is characterized by an electrical resistivity that is relatively lesser than the electrical resistivity of the first material 110. That is, the second material 112 is more electrically conductive per unit cross-sectional area than the first material 110. The second material 112 can be defined by or include zirconium tungstate ($ZrW_2O_8$), or hafnium tungstate ($HfW_2O_3$). Other suitable materials can also be used.

The first material 110 is also characterized by a positive thermal expansion. Thus, the first material (slabs or portions) 110 expands volumetrically when heated. In this way, the first material 110 is always in contact with both electrodes 102 and 106, and the second material 112 during changes in temperature.

The second material 112 is further characterized by a negative thermal expansion. Thus, the second material 112 contracts volumetrically when heated above. The second material 112 is in contact with (or is nearly in contact with) at least one or both electrodes 102 and 106 at some baseline temperature. Heating or thermoelectric warming of the second material 112 above the baseline temperature, over some threshold value, causes the second material 112 to contract out of contact with (or draw farther away from) one or both of the electrodes 102 and 106. Further discussion regarding the respective expansion and contraction characteristics of the first and second materials 110 and 112 is provided hereinafter.

Table 1 below includes illustrative and non-limiting characteristics for an NDR device 100. Other NDR devices having respectively varying dimensions, characteristics or constituencies are also contemplated by the present teachings. It is noted that within Table 1, "μm" equals $1 \times 10^{-6}$ meters and "nm" equals $1 \times 10^{-9}$ meters.

TABLE 1

Illustrative NDR Device 100

| Feature | Dimensions X - Y - Z | Notes |
|---|---|---|
| Electrode 102 | 0.1 μm × 0.1 μm × 0.5 μm | Aluminum |
| Electrode 106 | 0.1 μm × 0.1 μm × 0.5 μm | Aluminum |
| Material 110 | 0.1 μm × 0.1 μm × 10.0 nm | $Al_2O_3$ |
| Material 112 | 0.1 μm × 0.1 μm × 10.0 nm | $ZrW_2O_8$ |

Characteristic Resistance Curve

Figure 2:
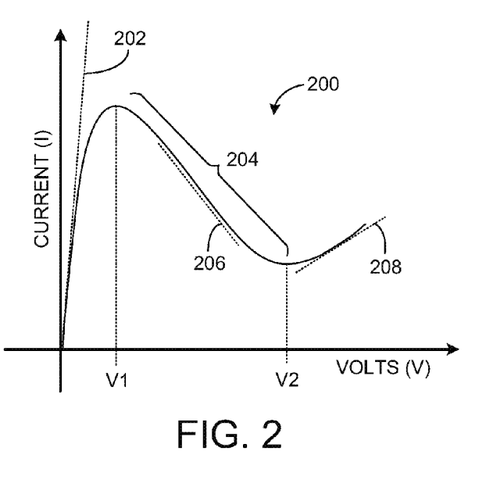
FIG. 2 depicts a voltage-versus-current response curve according to another example of the present teachings.

Attention is now directed to FIG. 2, which depicts a voltage-versus-current response curve 200. The curve 200 is also referred to as an electrical resistance curve 200 for purposes herein. The curve 200 depicts electrical behavior of the NDR device 100 of particular interest to the present teachings. Thus, the curve 200 is illustrative and non-limiting in nature.

The curve 200 depicts current flow through the device 100, from electrode 102 to electrode 106, as a function of voltage applied to (i.e., across) the electrodes 102 and 106. That is, voltage is considered as the independent variable. Correspondingly, electrical resistance—the ratio of voltage to current—is dependant upon or a function of applied voltage and is designated herein as "R(V)".

It is noted that the curve 200 depicts a non-linear relationship between voltage and current (and thus the electrical resistance) of the device 100. In particular, the resistance of the device 100 is relatively low at lower values of applied voltage "V". This is depicted by the tangent line 202, which has a relatively steep positive slope. Electrical resistance of the device 100 is about constant and relatively low with increasing values of applied voltage "V" from about zero volts to about voltage V1.

The electrical resistance of the device 100 then increases with increasing voltage "V" between a lesser voltage V1 and a greater voltage V2. This operating region is referred to as a negative different resistance (NDR) region 204 and is depicted by a tangent (or parallel) line 206. The electrical resistance of the device 100 is therefore greater at applied voltage V2 than at voltage V1.

The electrical resistance of the device 100 thereafter transitions at applied voltages "V" greater than V2 back to a positive slope. This is depicted by the tangent line 208. Electrical resistance of the device 100 is about constant and relatively high with increasing values of applied voltage greater than about voltage V2. The device 100 is therefore characterized by at least three distinct operating regions as depicted in TABLE 2 below:

TABLE 2

Illustrative Resistance Curve 200

| Voltage V | Electrical Resistance R(V) |
|---|---|
| V =< V1 | About constant and relatively low |
| V1 < V < V2 | Increasing with increase voltage "V" |
| V => V2 | About constant and relatively high |

Second Illustrative Device

Figure 3A:
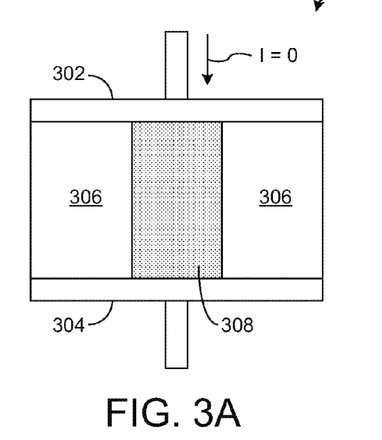
FIG. 3A is block diagrammatic view of an NDR device in a first operating state according to an example of the present teachings.

Attention is turned now to FIG. 3A, which depicts a block diagrammatic view of a device 300. The device 300 is illustrative and non-limiting in nature. Thus, other devices, apparatus and systems are contemplated by the present teachings. The device 300 is a negative differential resistance (NDR) device 300 in accordance with the present teachings.

The device 300 includes a first electrode 302 and a second electrode 304. Each of the electrodes 302 and 304 is formed from or includes a suitable electrically conductive material. Non-limiting examples of the electrodes 302 and 304 material include copper, aluminum, silver, gold, platinum, a metallic material, a doped semiconductor, and so on. Other suitable materials can also be used. In one example, the electrodes 302 and 304 are equivalent to the electrodes 102 and 106, respectively, as described above.

The device 300 also includes portions of a first material 306 disposed between and in contact with the electrodes 302 and 304. The first material 306 is characterized by a particular electrical resistivity and a positive thermal expansion. The respective electrodes 302 and 304 are in spaced relationship to one another by virtue of the portions of first material 306. In one example, the portions of first material 306 are formed from $Al_2O_3$. Other suitable materials can also be used.

The device 300 also includes a second material 308 disposed between the electrodes 302 and 304. The second material 308 is characterized by an electrical resistivity that is lesser than that of the first material 306. The second material 308 is also characterized by a negative thermal expansion. In one example, the second material 308 is defined by or includes $ZrW_2O_8$. Other suitable materials can also be used.

The device 300 is depicted under operating conditions in which zero (or about zero) electrical current flows through the device 300 between electrodes 302 and 304. No thermal-electric heating of the device 300 or the constituent materials 306 and 308 occurs under such zero-current conditions. The device 300 is therefore understood to be operating in steady-state at about a baseline temperature with no self-heating. In one example, such a baseline temperature is about one-hundred eighty five degrees Fahrenheit.

Under these baseline conditions, the portions of first material 306 and the second material 308 are in contact with both electrodes 302 and 304. The NDR device 300 is also characterized by a relatively low electrical resistance largely attributable to the lesser resistivity of the second material 308 and its contact with the electrodes 302 and 304.

Figure 3B:
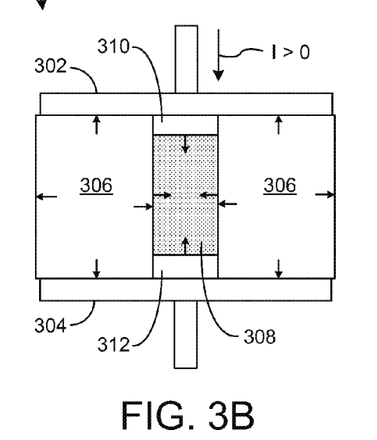
FIG. 3B is a block diagrammatic view of the NDR device of FIG. 3A in a second operating state.

Attention is now turned to FIG. 3B, which depicts the NDR device 300 operating in another state. Specifically, a non-zero electrical current is flowing through the device 300 between the electrodes 302 and 304 as a result of a corresponding applied voltage. Thermal-electric heating of the device 300 has occurred as a result of the electrical current. The NDR device of FIG. 3B is also understood to be in a steady-state condition, wherein physical and electrical characteristics are at equilibrium at some temperature greater than baseline.

The first material 306 has expanded volumetrically such that the electrodes 302 and 304 have been spaced further apart relative to the baseline condition. In turn, the second material 308 has contracted volumetrically and is no longer in contact with the first electrode 302 nor the second electrodes 304. Thus, respective gaps 310 and 312 are present between the second material 308 and the electrodes 302 and 304. The NDR device 300 is now characterized by a relatively higher electrical resistance by virtue of the volumetrically contracted condition of the second material 308 and loss of direct contact with the electrodes 302 and 304.

In general, the device 300 is depicted in two respectively different operating states in FIGS. 3A and 3B. Specifically, a baseline condition corresponding to zero electrical current and zero applied voltage is characterized by a relatively lower electrical resistance of the device 300 as depicted in FIG. 3A. In turn, a second condition corresponding to non-zero current (and applied voltage) is characterized by a relatively higher electrical resistance of the device 300 as depicted in FIG. 3B. Removal of the applied voltage (applied current) results in cooling of the device 300 and a return to or towards the baseline conditions. In one example, the device 300 can be dynamically operated between these two or other respective operating states.

Third Illustrative Device

Figure 4A:
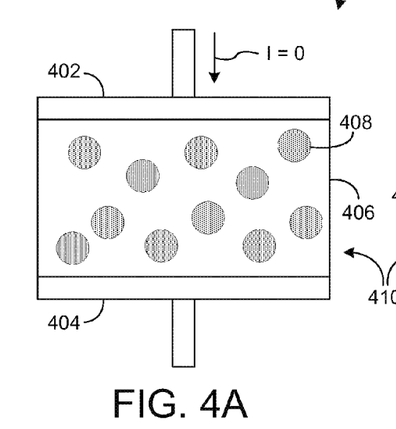
FIG. 4A is block diagrammatic view of another NDR device in a first operating state according to the present teachings.

Attention is turned now to FIG. 4A, which depicts a block diagrammatic view of a device 400. The device 400 is illustrative and non-limiting in nature. Thus, other devices, apparatus and systems are contemplated by the present teachings. The device 400 is a negative differential resistance (NDR) device in accordance with the present teachings.

The device 400 includes a first electrode 402 and a second electrode 404. Each of the electrodes 402 and 404 is formed from or includes a suitable electrically conductive material. Non-limiting examples of the electrodes 402 and 404 material include copper, aluminum, silver, gold, platinum, a metallic material, a doped semiconductor, and so on. Other suitable materials can also be used. In one example, the electrodes 402 and 404 are equivalent to the electrodes 102 and 106, respectively, as described above.

The device 400 also includes a first material 406. The first material 406 is characterized by a particular electrical resistivity and a positive thermal expansion. The respective electrodes 402 and 404 are in spaced relationship to one another by virtue of the first material 406. In one example, the portions of first material 406 are formed from $Al_2O_3$. Other suitable materials can also be used.

The device 400 also includes a second material 408 disposed between the electrodes 402 and 404. The second material 408 is characterized by a lesser electrical resistivity than that of the first material 406. The second material 406 is also characterized by a negative thermal expansion. In one example, the second material 408 is defined by or includes $ZrW_2O_8$. Other suitable materials can also be used.

The first material 406 and the second material 408 are combined such that an aggregate or granular material 410 is defined. The aggregate material 410 includes portions of the second material 408 depicted as spherical masses within the first material 406. However, the second material 408 can be provided, mixed or blended within the first material 406 in any number of suitable ways. Furthermore, the mass or volumetric ratio of the first material 406 to the second material 408 can be suitably varied. In one example, the volumetric ratio of first material 406 to second material 408 is 1:1. Other ratios can also be used.

The device 400 is depicted under operating conditions where zero (or about zero) electrical current flows through the device 400 between electrodes 402 and 404. No thermal-electric heating of the device 400 or the constituent materials 406 and 408 occurs under such steady-state, zero-current conditions. Under the baseline conditions depicted in FIG. 4A, the NDR device 400 is characterized by a relatively low electrical resistance, which is largely attributable to the lesser resistivity of the second material 408.

Figure 4B:
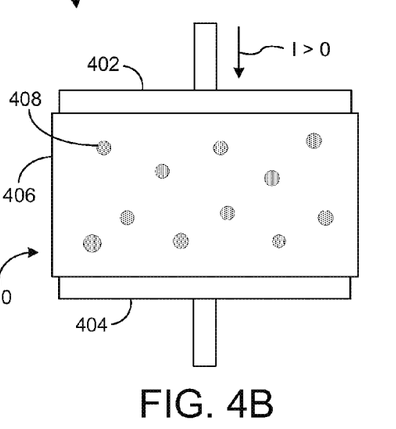
FIG. 4B is a block diagrammatic view of the NDR device of FIG. 4A in a second operating state.

Attention is now turned to FIG. 4B, which depicts another operational state of the NDR device 400. Specifically, a non-zero electrical current is flowing through the device 400 between the electrodes 402 and 404 as a result of a corresponding applied voltage. Thermal-electric heating of the device 400 has occurred as a result of the electrical current. The NDR device of FIG. 4B is also understood to be in a steady-state condition, wherein physical and electrical characteristics are at equilibrium at some temperature greater than baseline.

The first material 406 has expanded volumetrically such that the electrodes 402 and 404 have been spaced further apart relative to the baseline condition. In turn, the second material 408 has contracted volumetrically within the expanded first material 406. The NDR device 400 is now characterized by a relatively higher electrical resistance by virtue of the volumetrically contracted condition of the second material 408. In particular, there is reduced surface area contact overall between the first material 406 and the second material 408.

In general, the device 400 is depicted in two respectively different operating states in FIGS. 4A and 4B. Specifically, a baseline condition corresponding to zero electrical current and zero applied voltage is characterized by relatively lower electrical resistance of the device 400 as depicted in FIG. 4A. Contrastingly, a second condition corresponding to non-zero applied voltage (and current) is characterized by relatively higher electrical resistance of the device 400 as depicted in FIG. 4B. Removal of the applied voltage results in cooling of the device 400 and a return to or towards the baseline conditions. In one example, the device 400 can be dynamically operated between these two or other respective operating states.

Each of the NDR devices 300 and 400 exhibit electrical characteristics in accordance with the present teachings, including respective electrical resistance curves (e.g., curve 200). Such electrical resistance curves are a non-linear function of applied voltage and include respective negative differential resistance ranges.

First Illustrative Apparatus

Figure 5:
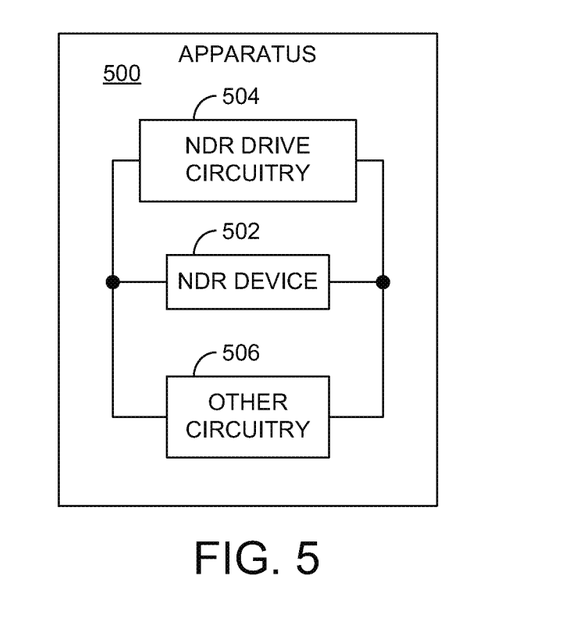
FIG. 5 depicts a block diagram of an apparatus according to one example of the present teachings.

FIG. 5 depicts a block diagram of an apparatus 500 in accordance with the present teachings. The apparatus 500 is illustrative and non-limiting in nature. Other devices, apparatus and systems are contemplated by the present teachings.

The apparatus 500 includes an NDR device 502 in accordance with the present teachings. The NDR device 502 is characterized by a non-linear electrical resistance curve as a function of applied voltage.

The apparatus 500 includes NDR drive circuitry (circuitry) 504. The circuitry 504 is configured to provide a selectively controlled voltage or current to the NDR device 502. The circuitry 504 can be variously defined and can include a microprocessor, a microcontroller, a state machine, digital or analog or hybrid circuitry, a source of electrical energy, and so on. The NDR device 502 can be operated in a plurality of different modes or states by way of the NDR drive circuitry 504.

The apparatus 500 also includes other circuitry 506. The other circuitry 506 can be defined by any electronic circuitry configured to perform normal operations germane to the apparatus 500. For non-limiting example, the other circuitry 506 can be configured for cellular communications, data storage, network communications, instrumentation and control, biometrics, and so on. The electronic circuitry 506 is electrically coupled to the NDR device 502 so as to determine an instantaneous electrical operating state thereof. The electronic circuitry 506 then uses this determination in the performance of normal operations.

The apparatus 500 illustrates that the NDR devices of the present teachings can be used in any number of various applications. In one example, the present operating state (i.e., electrical resistance) of an NDR device is correlated to a data value (e.g., one or zero) or an outcome of a logical operation (e.g., AND, OR, NOR, NAND, NOT). Other suitable apparatus including one or more NDR devices of the present teachings can also be defined, configured and used.

First Illustrative Method

Figure 6:
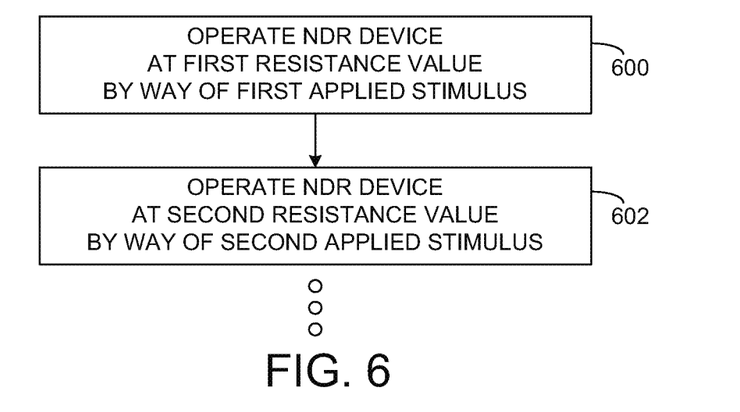
FIG. 6 is a flow diagram depicting a method according to one example of the present teachings.

Attention is now directed to FIG. 6, which depicts a method according to one embodiment of the present teachings. The method of FIG. 6 depicts particular method steps and an order of execution. However, it is to be understood that other methods including other steps, omitting one or more of the depicted steps, or proceeding in other orders of execution are also contemplated. Thus, the method of FIG. 6 is illustrative and non-limiting with respect to the present teachings. Reference is made to FIG. 5 in the interest of understanding the method of FIG. 6.

At 600, an NDR device is operated at a present electrical resistance by way of an applied electrical stimulus. For purposes of non-limiting illustration, it is assumed that the NDR drive circuitry 504 applies a drive voltage of zero-point-five Volts to the NDR device 502. The NDR device 502 is characterized by a present electrical resistance value of two kilo-ohms. Other circuitry 506 of the apparatus 500 is electrically coupled to the NDR device 502 and operates in accordance with the present electrical resistance value of the NDR device 502.

At 602, an NDR device is operated at another electrical resistance by way of a different applied electrical stimulus. For purposes of the present illustration, the NDR drive circuitry 504 applies a drive voltage of one Volt to the NDR device 502. The NDR device 502 is characterized by a present electrical resistance value of three kilo-ohms. The other circuitry 506 senses the new electrical resistance state of the NDR device 502 and operates accordingly.

The method of FIG. 6 can continue operating in the manner illustrated above for any number of steps. An NDR device can be subject to various electrical stirs (currents or voltages) within a predetermined operating range and in any order of application. The resulting electrical resistance response can be suitably detected and used in the control or selection of other operations of a corresponding apparatus.

Second Illustrative Apparatus

Figure 7:
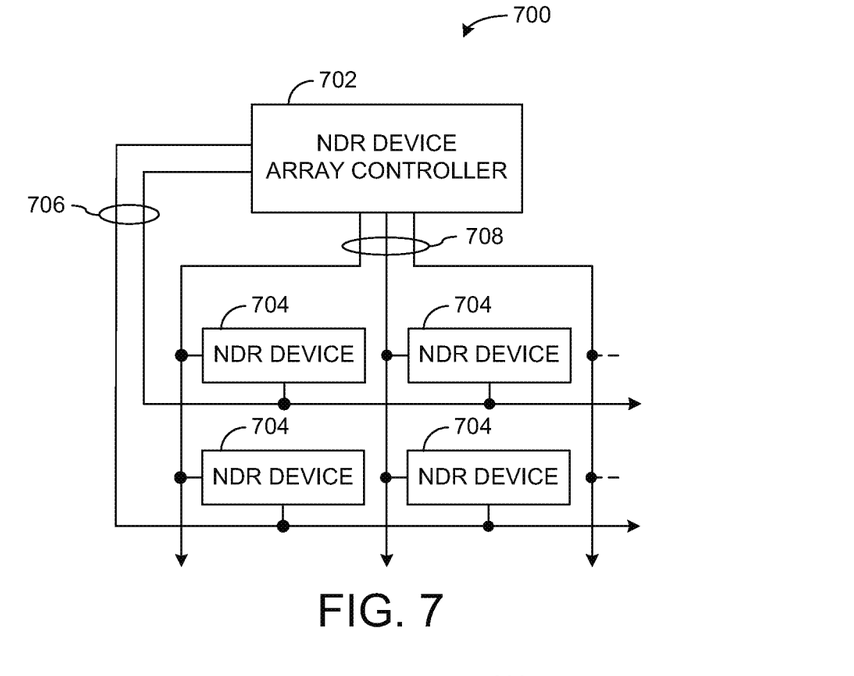
FIG. 7 depicts a block diagram of an apparatus according to another example of the present teachings.

Reference is now made to FIG. 7, which depicts a block diagram of an apparatus 700 according to another example of the present teachings. The apparatus 700 is illustrative and non-limiting in nature. Thus, other devices, apparatus, circuits and systems are contemplated that include one or more aspects of the present teachings.

The apparatus 700 includes NDR device array controller (controller) 702. The controller 702 is configured to address individual NDR devices 704 of the apparatus 700. Such addressing is performed by way of row control lines 706 and column control lines 708. The controller 702 is also configured to apply electrical stimulus signals (currents or voltages) to selected ones of the NDR devices 704 by way of the controls lines 706 and 708.

The device 700 further includes a plurality of NDR devices 704. Each NDR device 704 is defined, configured and operative in accordance with the present teachings. In one example, one or more of the NDR devices 704 is/are materially and operationally equivalent to the NDR device 100 described above. In another example, one or more of the memristors 704 is/are equivalent to the NDR device 400 described above. Other configurations can also be used.

The NDR devices 704 are arranged as an X-by-Y array, with each NDR device 704 being individually addressable and operable by way of the controller 702. Each NDR device 704 can be operated as a storage cell representing digital data, a logical operation gate, and so on. FIG. 7 depicts a total of four NDR devices 704 arranged as an array. However, it is to be understood that other arrays including any suitable number of matched or different NDR devices can also be defined and operated in accordance with the present teachings. Stacking the NDR device array depicted in FIG. 7 so as to construct a three dimensional array is also contemplated.

Third Illustrative Apparatus

Figure 8:
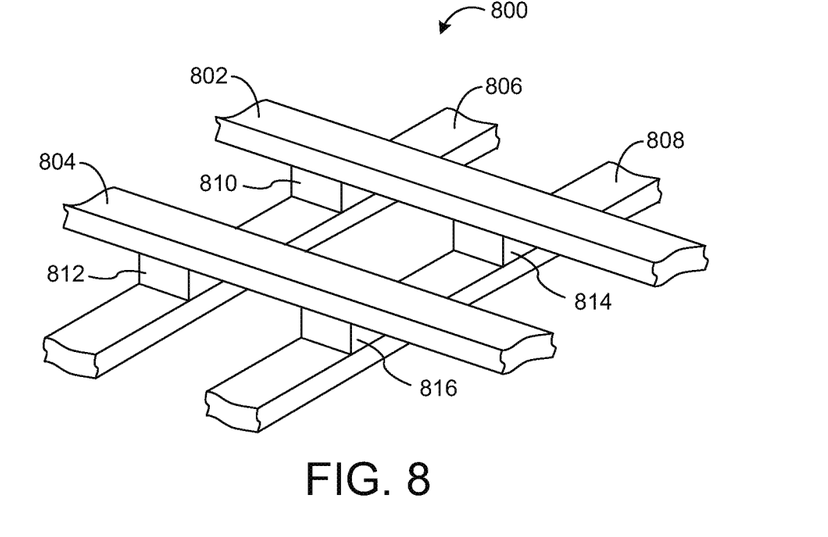
FIG. 8 depicts an isometric-like view of an array according to an example of the present teachings.

Attention is now directed to FIG. 8, which depicts an array 800 according to the present teachings. The array 800 is illustrative and non-limiting in nature, and other arrays and apparatus can be defined and used according to the present teachings.

The array 800 includes a first crossbar 802, a second crossbar 804, a third crossbar 806 and a fourth crossbar 808. Each of the respective crossbars 802-808, inclusive, can be formed from or include any suitable electrically conductive material such as, for non-limiting example, copper, aluminum, silver, gold, platinum, palladium, hafnium nitride, titanium nitride (TiN), a metallic material, a doped semiconductor, and so on. Other suitable materials can also be used.

The crossbars 802 and 804 are disposed in spaced parallel adjacency. In turn, the crossbars 806 and 808 are disposed in spaced parallel adjacency and are generally perpendicular to the crossbars 802 and 804. Additionally, the crossbars 802 and 804 generally overlie and are spaced apart from the crossbars 806 and 808 such that an elevational offset is also defined. Respective overlying proximity or "cross-over" locations between any two crossbars are referred to as "intersections" for purposes herein.

The array 800 is also defined by four NDR devices located at four respective intersections of the crossbars. Specifically, a first NDR device 810 is present at an intersection defined by the crossbars 802 and 806. A second NDR device 812 is located at an intersection defined by crossbars 804 and 806. A third NDR device 814 is located at an intersection defined by crossbars 802 and 808. Furthermore, a fourth NDR device 816 is located at an intersection defined by crossbars 804 and 808.

Each of the respective NDR devices 810, 812, 814 and 816 can be defined by any suitable embodiment according to the present teachings. For example, any one or more or all of the NDR devices 810-816 can be substantially defined as described above in regard to the NDR device 100. Other NDR device embodiments as described hereinafter can also be used. Each NDR device 810-816 can have either or both of its respective electrodes (e.g., 102 and 106) defined at least in part by a corresponding crossbar.

The array 800 depicts a total of four NDR devices 810-816 that can be individually accessed (i.e., electrically driven or monitored) by way of the corresponding crossbars 802-808. For non-limiting example, the NDR device 814 can be operated at a selected electrical state or mode using an appropriate stimulus current (or voltage) applied by way of the crossbars 802 and 808. It should be apparent to one of ordinary skill in the electrical arts that other arrays having any suitable number of individually accessible NDR devices can also be defined and used. Thus, the size of a (crossbar) array can be one-thousand by one-thousand or even larger, depending on the embodiment, applications, associated circuit design, etc.

In general and without limitation, the present teachings contemplate various negative differential resistance devices that can be applied to any number of circuits, devices and apparatus. Each NDR device includes two electrically conductive electrodes and at least two different materials disposed there between. The two materials can be provided as respective layers or slab-like portions, or as constituents of an aggregate or granular material, or as a combination of homogenous layers and aggregate materials. At least one of the different materials is selected to exhibit a negative thermal expansion and relatively lesser electrical resistivity, while another of the materials is selected to exhibit a positive thermal expansion and a relatively greater electrical resistivity.

Each NDR device is characterized by a non-linear voltage-versus-current curve, also referred to as an electrical resistance curve that includes a negative differential resistance range. Each NDR device therefore exhibits an electrical resistance that various as a function of applied voltage or current. The Applied voltage or current can be used as stimulus to operate a particular NDR device at any of the various electrical resistances within its range.

Control circuitry is used to apply various stimulus voltages or currents of respective magnitudes, polarities or durations to a particular NDR device or devices. The application of such a stimulus causes a corresponding shift in the overall electrical resistance of the NDR device, particularly within a negative differential resistance operating range. The instantaneous resistance of an NDR device can be correlated to a respective data value, logical operation, and so on. As such, NDR devices of the present teachings can be used as data storage elements, Boolean logic gates, and in other applications.

In general, the foregoing description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

What is claimed is:

1. A device, comprising:
    a first electrode;
    a second electrode spaced apart from the first electrode;
    a first material disposed between and in contact with the first electrode and the second electrode, the first material characterized by a first electrical resistivity; and
    a second material disposed between the first electrode and the second electrode, the second material characterized by negative thermal expansion and a second electrical resistivity lesser than the first electrical resistivity, the device characterized by an electrical resistance curve that varies non-linearly as a function of applied voltage.

2. The device according to claim 1, the electrical resistance curve of the device further characterized by a negative differential resistance between a first applied voltage and a second applied voltage greater than the first applied voltage.

3. The device according to claim 1, the first material being characterized by positive thermal expansion.

4. The device according to claim 1, the first material including at least Al2O3, SiO2 or HfO2.

5. The device according to claim 1, the second material including at least ZrW2O8 or HfW2O8.

6. The device according to claim 1, second material being about in contact with respective areas of the first and second electrodes when about zero current flows through the device, the second material contracting and the first material expanding such that second material is drawn away from at least one of the first electrode or the second electrode when an electrical current greater than a threshold value flows though the device.

7. The device according to claim 1, the first material being disposed about and in contact with at least some of the second material.

8. The device according to claim 1, the first and second electrodes defined by respective portions of a first electrically conductive crossbar and a second electrically conductive crossbar.

9. The device according to claim 1, the first material and the second material combined so as to define an aggregate material.

10. The device according to claim 1, at least the first electrode or the second electrode formed from a metal, a metallic material or a doped semiconductor material.

11. A method, comprising:
    operating a negative differential resistance (NDR) device at a first electrical resistance by way of a first applied voltage, the NDR device having a first material and a second material respectively disposed between a first electrode and a second electrode, the second material having a negative thermal expansion characteristic; and
    operating the NDR device at a second electrical resistance by way of a second applied voltage, the second electrical resistance greater than the first electrical resistance, the second applied voltage greater than the first applied voltage.

12. The method according to claim 11, the second material being at least partially surrounded by the first material, the first material characterized by a first electrical resistivity, the second material characterized by a second electrical resistivity lesser than the first electrical resistivity.

13. The method according to claim 11 further comprising operating the NDR device at a third electrical resistance by way of a third applied voltage, the third electrical resistance greater than the first electrical resistance and lesser than the second electrical resistance.

14. The method according to claim 11 further comprising correlating a present electrical resistance of the NDR device with a data value by way of electronic circuitry.

15. The method according to claim 11 further comprising correlating a present electrical resistance of the NDR device with a logical operation by way of electronic circuitry.

* * * * *